(12) United States Patent
Lam et al.

(10) Patent No.: US 8,937,500 B2
(45) Date of Patent: Jan. 20, 2015

(54) DELAY METHOD, CIRCUIT AND INTEGRATED CIRCUIT

(71) Applicant: Fairchild Semiconductor Corporation, San Jose, CA (US)

(72) Inventors: Ming Chuen Alvan Lam, Scarborough, ME (US); Weiming Sun, Beijing (CN); Emma Wang, Beijing (CN); Peng Zhu, Tianjin (CN)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/109,161

(22) Filed: Dec. 17, 2013

(65) Prior Publication Data

US 2014/0167829 A1    Jun. 19, 2014

(51) Int. Cl.
*H03K 5/14*      (2014.01)

(52) U.S. Cl.
CPC ........................................ *H03K 5/14* (2013.01)
USPC ............................. 327/278; 327/285; 327/298

(58) Field of Classification Search
CPC ........... H03K 2005/00058; H03K 2005/00052
USPC .......................... 327/276, 278, 285, 298–299
See application file for complete search history.

(56) References Cited

U.S. PATENT DOCUMENTS 8,686,777 B1 *   4/2014   Narang et al. ................. 327/261
8,786,347 B1 *   7/2014   Chakraborty et al. ........ 327/265

* cited by examiner

*Primary Examiner* — An Luu
(74) *Attorney, Agent, or Firm* — Schwegman Lundberg & Woessner, P.A.

(57) ABSTRACT

This document discusses, among other things, a delay circuit, in which a first register is written with a delay reference code, a second register is written with a delay factor, a control unit determines a corresponding delay ratio in a storage unit based on the delay factor in the second register, and sends the determined delay ratio to a first digital timing unit, the first digital timing unit determines a delay reference time based on the delay reference code in the first register, multiplies the delay reference time by the delay ratio to result in a desired delay time, and generates a delay.

16 Claims, 4 Drawing Sheets

DELAY METHOD, CIRCUIT AND INTEGRATED CIRCUIT

CLAIM OF PRIORITY

This application claims the benefit of priority under 35 U.S.C. §119(a) of Alvan Lam et al. Chinese Patent Application Number 201210562262.8, titled "DELAY METHOD, CIRCUIT AND INTEGRATED CIRCUIT," filed on Dec. 17, 2012, which is incorporated by reference herein in its entirety.

TECHNICAL FIELD

This disclosure relates generally to time control techniques for integrated circuits, and in particular to a delay method, circuit, and integrated circuit.

BACKGROUND

Currently, for an integrated circuit, a desired delay is generally set by writing a fixed fuse code into the integrated circuit. However, bits for the fuse code are limited. For example, a seven-bit fuse code can provide 128 delay time lengths at most. Considering various user demands, it has become a problem to be urgently solved for an integrated circuit to provide an increased number of optional delay time lengths.

OVERVIEW

In view of the above, the disclosure provides, among others, a delay method, circuit, and integrated circuit.

In an example, a delay circuit is provided, which can include an oscillator for supplying clock signals, a first register, a second register, a control unit, a storage unit and a first digital timing unit. The first register is configured to be written with a delay reference code. The second register is configured to be written with a delay factor. The control unit is configured to determine a corresponding delay ratio in the storage unit based on the delay factor in the second register, and to send the determined delay ratio the first digital timing unit. The storage unit is configured to store all delay factors and their corresponding delay ratios. The first digital timing unit is configured to determine a delay time based on the delay reference code in the first register and the delay ratio, and to generate a delay based on the delay time.

According to some embodiments of the disclosure, a delay method is provided, in which a delay reference code and a delay ratio are written into different registers, respectively, a corresponding delay ratio is determined based on the delay factor in the register, a delay time is determined based on the delay reference code in the register and the delay ratio, and a delay is generated based on the delay time.

According to some embodiments of the disclosure, an integrated circuit is provided, which can include a delay circuit and a first action circuit. The delay circuit is configured to be written with a delay reference code and a delay factor, to determine a delay ratio corresponding to the delay factor, to determine a delay time based on the delay reference code and the delay ratio, to generate a delay based on the delay time, and to output an instruction signal to the first action circuit when the delay time expires. The first action circuit is configured to receive the instruction signal and to execute an action corresponding to the instruction signal.

According to the present disclosure, a delay reference code and a delay factor are written into different registers respectively, a corresponding delay ratio is determined based on the delay factor in the register, a corresponding delay reference time is determined based on the delay reference code, a desired delay time is determined based on the delay ratio and the delay reference time, and a delay is generated based on the delay time. In this way, different delay time lengths may be resulted by writing different delay factors, that is the number of optional delay time lengths may be increased and thus delay accuracy may be improved.

This overview is intended to provide an overview of subject matter of the present patent application. It is not intended to provide an exclusive or exhaustive explanation of the invention. The detailed description is included to provide further information about the present patent application.

DETAILED DESCRIPTION

Figure 1:
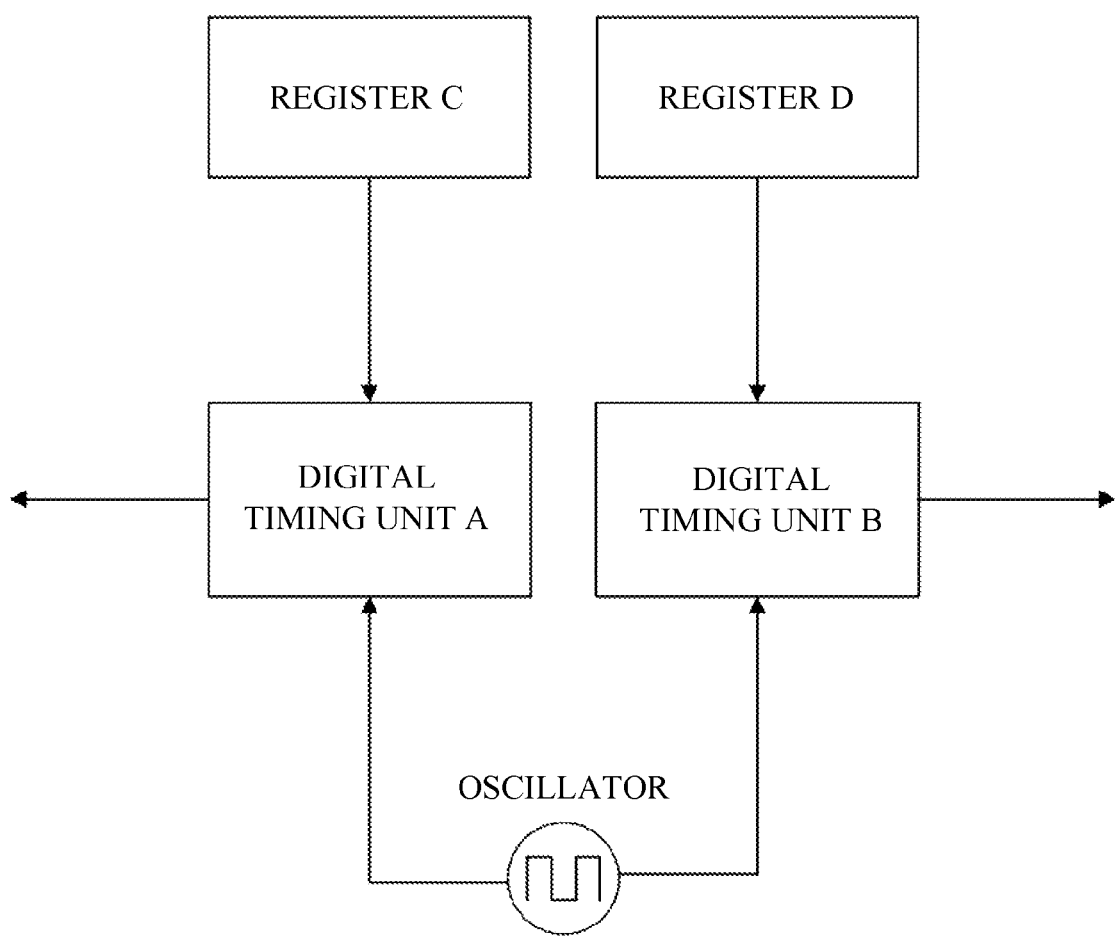
FIG. 1 is a block diagram illustrating an example delay circuit according to the prior art.

As shown in FIG. 1, in an example delay circuit, an oscillator supplies clock signals to digital timing units A and B, respectively. Registers C and D are written with different fuse codes, respectively. Each of the digital timing units determines a delay time based on the fuse code written into the respective register coupled to the digital timing unit and generates a delay based on the corresponding delay time. In this delay circuit, each of the digital timing units can be provided with a fuse code, and the number of delay time lengths that can be generated depends on the number of bits for the fuse code. Therefore, the number of optional delay time lengths is relatively small.

Figure 2:
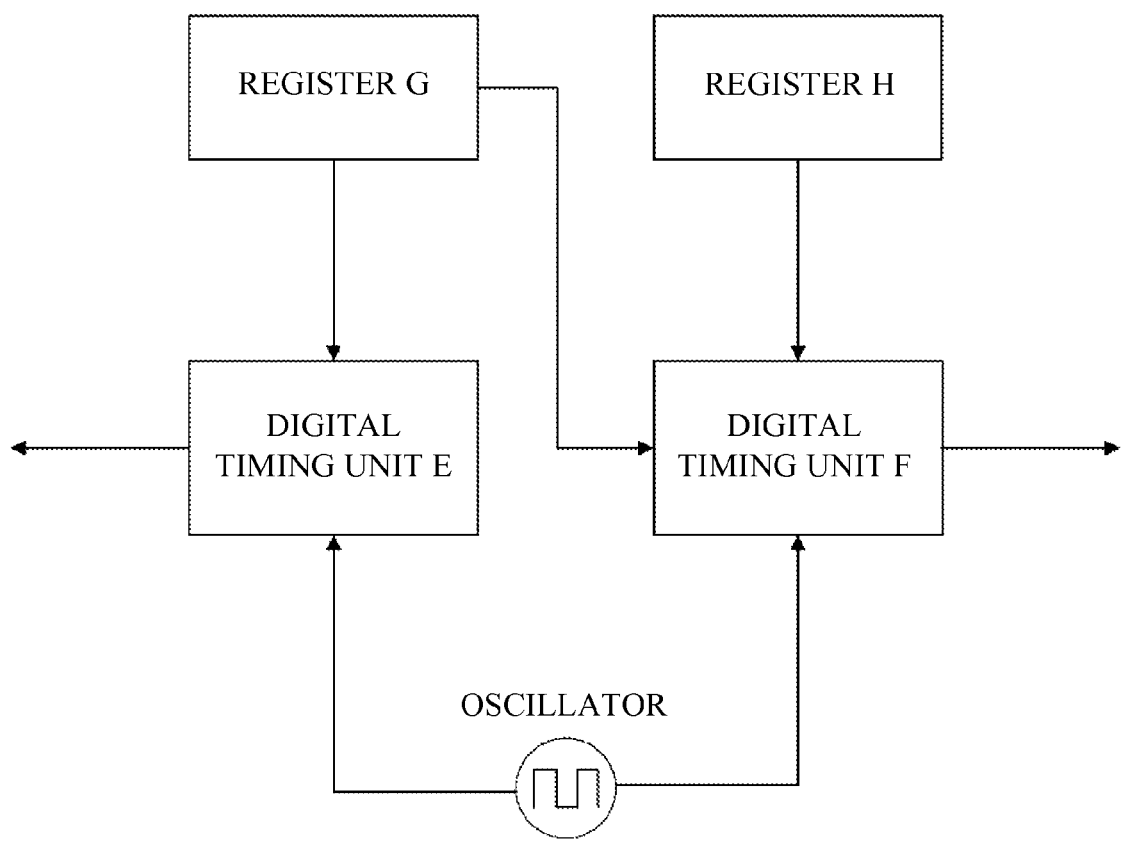
FIG. 2 is a block diagram illustrating another example delay circuit according to the prior art.

As shown in FIG. 2, in another delay circuit, an oscillator supplies clock signals to digital timing units E and F, respectively. Register G, coupled to the digital timing unit E, is written with a fuse code. Register H, coupled to the digital timing unit F, is written with a fixed delay ratio. Register G is also coupled to digital timing unit F. Digital timing unit E determines a delay time based on the fuse code written into the register G and generates a delay based on the corresponding delay time. The digital timing unit F multiplies the delay ratio in register H by the delay time corresponding to the fuse code in the register G to result in a delay time and generates a delay based on the resulted delay time. In this delay circuit, since the delay ratio written into the register H is a fixed value, it is impossible to provide a large number of optional delay time lengths. Therefore, the existing delay circuit fails to provide a sufficient number of delay time lengths.

According to various embodiments of the disclosure, a delay reference code and a delay factor are written into different registers respectively, a delay ratio is determined based on the corresponding delay factor in the register, a corresponding delay reference time is determined based on the delay reference code, a desired delay time is determined based on the delay ratio and the delay reference time, and a delay is generated based on the delay time.

The disclosure will be described in detail with reference to the drawings and the specific embodiments.

Figure 3:
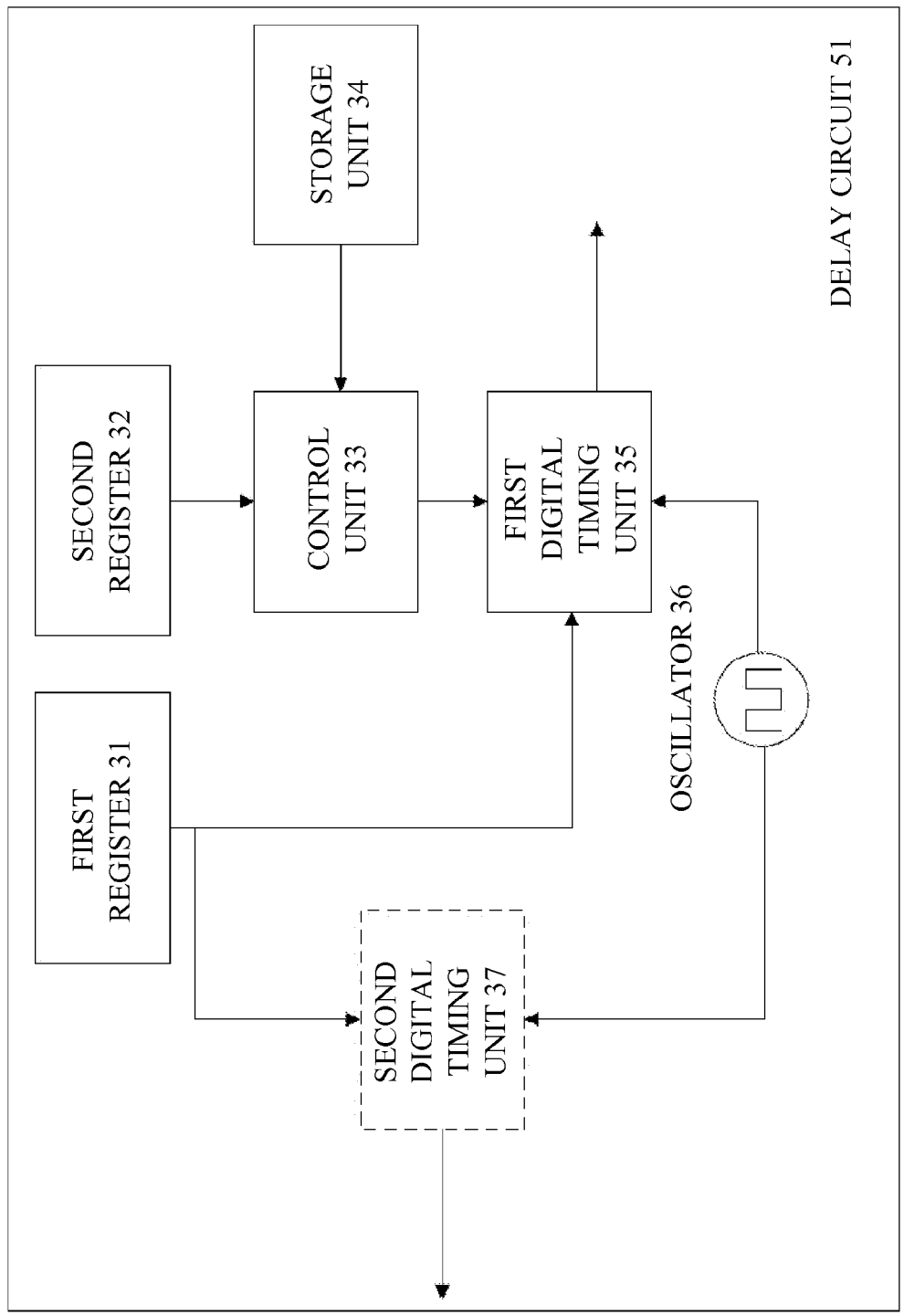
FIG. 3 is a block diagram illustrating a delay circuit according some embodiments of the disclosure.

As shown in FIG. 3, a delay circuit according to some embodiments of the disclosure can include an oscillator 36 for supplying clock signals, a first register 31, a second register 32, a control unit 33, a storage unit 34, and a first digital timing unit 35.

The first register 31 is configured to be written with a delay reference code. In an embodiment, the delay reference code may be a fuse code or a digital code.

The second register 32 is configured to be written with a delay factor. In an embodiment, the delay factor may be a fuse code or a digital code.

The control unit 33 is configured to determine a delay ratio in the storage unit 34 based on the corresponding delay factor in the second register 32, and to send the determined delay ratio to the first digital timing unit 35.

The storage unit 34 is configured to store all delay factors and their corresponding delay ratios.

The first digital timing unit 35 is configured to determine a delay time based on the delay reference code in the first register 31 and the delay ratio, and to generate a delay based on the delay time.

The delay factor may be preset based on the desired delay time and may consist of at least one bit. For example, if the delay factor consists of 1 bit, 2 corresponding delay ratios may be provided; if the delay factor consists of 2 bits, 4 corresponding delay ratios may be provided; if the delay factor consists of 3 bits, 8 corresponding delay ratios may be provided; if the delay factor consists of 4 bits, 16 corresponding delay ratios may be provided, and so forth.

Table 1 presents two examples of the delay circuit according to the disclosure. The first example is intended to provide a timer delay before reset, where tPHL1 is the first register 31, has 7 bits, and provides a delay reference time in a range of 3 to 20 seconds; f1 is the second register 32, has 2 bits corresponding to four delay ratios; and tVON denotes a turn-on time for an output voltage Vout of the delay circuit.

The second example is intended to provide a reset timeout delay of Vout, where tREC1 is the first register 31, has 7 bits, and provides a delay reference time in a range of 80 to 800 ms; f2 is the second register 32, has 4 bits corresponding to 16 delay ratios; and tSD denotes a delay to turn off load switch of the delay circuit.

TABLE 1

| Parameter Name | Symbol | Type of Fuse Pro-grammable | Programmable Range |
|---|---|---|---|
| Timer Delay before Reset | tPHL1 | 7-bit | 3 seconds (s) to 20 s (current: 7.5 s) |
| Reset Timeout Delay of VOUT | tREC1 | 7-bit | 80 ms to 800 ms (current: 400 ms) |
| | f1 | 2-bit | 3/16 |
| | | | 4/16 |
| | | | 5/16 |
| | | | 8/16 |
| | f2 | 4-bit | 2/16 |
| | | | 4/16 |
| | | | 8/16 |
| | | | 12/16 |
| | | | 24/16 |
| | | | 36/16 |
| | | | 68/16 |
| | | | 100/16 |
| | | | 132/16 |
| | | | 164/16 |
| | | | 196/16 |
| | | | 228/16 |

TABLE 1-continued

| Parameter Name | Symbol | Type of Fuse Pro-grammable | Programmable Range |
|---|---|---|---|
| | | | 260/16 |
| | | | 292/16 |
| | | | 324/16 |
| | | | 356/16 |
| Turn-On Time for VOUT | tVON | 2-bit | 3/16 × tPHL1(0.19 × tPHL1) |
| | | | 4/16 × tPHL1(0.25 × tPHL1) |
| | | | 5/16 × tPHL1(0.31 × tPHL1) - default |
| | | | 8/16 × tPHL1(0.50 × tPHL1) |
| Delay to Turn Off Load Switch | tSD | 4-bit | 2/16 × tREC1(0.125 × tREC1) |
| | | | 4/16 × tREC1(0.25 × tREC1) |
| | | | 8/16 × tREC1(0.5 × tREC1) |
| | | | 12/16 × tREC1(0.75 × tREC1) |
| | | | 24/16 × tREC1(1.5 × tREC1) |
| | | | 36/16 × tREC1(2.25 × tREC1) |
| | | | 68/16 × tREC1(4.25 × tREC1) |
| | | | 100/16 × tREC1(6.25 × tREC1) |
| | | | 132/16 × tREC1(8.25 × tREC1) |
| | | | 164/16 × tREC1(10.25 × tREC1) |
| | | | 196/16 × tREC1(12.25 × tREC1) |
| | | | 228/16 × tREC1(14.25 × tREC1) |
| | | | 260/16 × tREC1(16.25 × tREC1) |
| | | | 292/16 × tREC1(18.25 × tREC1)-default |
| | | | 324/16 × tREC1(20.25 × tREC1) |
| | | | 356/16 × tREC1(22.25 × tREC1) |

In an embodiment, the storage unit 34 may be configured to pre-store all delay factors and their corresponding delay ratios in a table, in which the delay factors and their corresponding delay ratios are sorted in an ascending order of values of the corresponding delay factors.

In an embodiment, the control unit 33 may be configured to determine a corresponding delay ratio from the table in the storage unit 34 based on the delay factor in the second register 32, and to send the determined delay ratio to the first digital timing unit 35.

In an embodiment, the first digital timing unit 35 may be configured to preset delay reference codes and corresponding delay reference times, to determine a corresponding delay reference time based on the delay reference code in the first register 31, to multiply the delay reference time by the delay ratio to result in a desired delay time, and to generate a delay based on the desired delay time.

In an embodiment, the delay circuit may also include a second digital timing unit 37 configured to determine a corresponding delay reference time based on the delay reference code in the first register 31 and to generate a delay based on the delay reference time.

Figure 4:
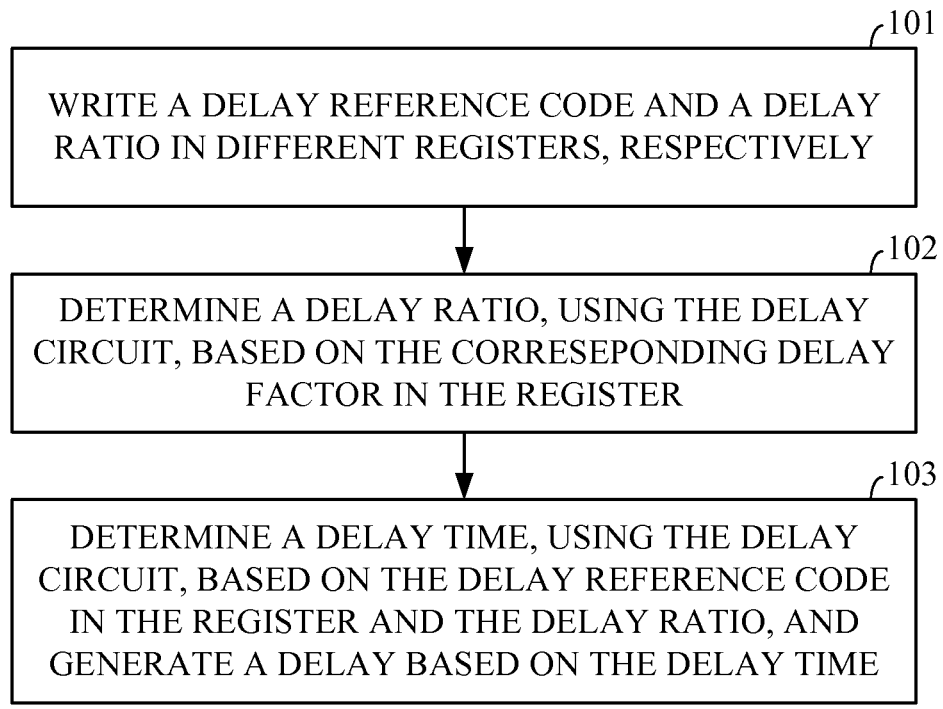
FIG. 4 is a flow chart illustrating a delay method according some embodiments of the disclosure.

Based on the delay circuit described above, a delay method is provided in some embodiments of the disclosure, as shown in FIG. 4. The method includes the following steps:

In Step 101, a delay reference code and a delay ratio are written into different registers respectively.

Here, each of the delay reference code and the delay ratio may consist of a fuse code or a digital code. The delay factor may be preset based on the desired delay time and may consist of at least one bit. For example, if the delay factor consists of 1 bit, 2 corresponding delay ratios may be provided; if the delay factor consists of 2 bits, 4 corresponding delay ratios may be provided; if the delay factor consists of 3 bits, 8 corresponding delay ratios may be provided; if the delay factor consists of 4 bits, 16 corresponding delay ratios may be provided, and so forth.

In Step 102, the delay circuit finds out a delay ratio based on the corresponding delay factor in the register.

In an embodiment, all delay factors and their corresponding delay ratios may be pre-stored in a table, in which the delay factors and their corresponding delay ratios are sorted in an ascending order of values of the corresponding delay factors.

In Step 103, the delay circuit determines a delay time based on the delay reference code in the register and the delay ratio, and generates a delay based on the delay time.

In an embodiment, delay reference codes and corresponding delay reference times may be preset, the delay circuit finds out a corresponding delay reference time based on the delay reference code in the register, multiplies the delay reference time by the delay ratio to result in a desired delay time, and generates a delay based on the desired delay time.

In an embodiment, in the delay method, the delay circuit may determine a delay reference time based on the delay reference code in the register and generates another delay based on the delay reference time.

Figure 5:
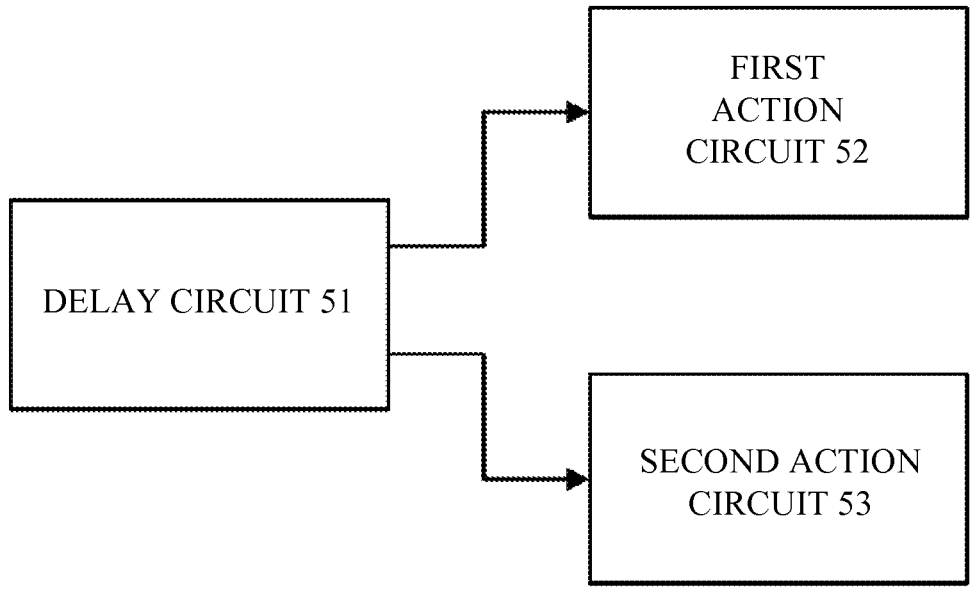
FIG. 5 is a block diagram illustrating an integrated circuit according some embodiments of the disclosure.

Based on the delay circuit described above, an integrated circuit is provided according to some embodiments of the disclosure. As shown in FIG. 5, the integrated circuit can include a delay circuit 51 and a first action circuit 52.

The delay circuit 51 is configured to be written with a delay reference code and a delay factor, to determine a delay ratio corresponding to the delay factor, to determine a delay time based on the delay reference code and the delay ratio, to generate a delay based on the delay time, and to output an instruction signal to the first action circuit 52 when the delay time expires.

The first action circuit 52 is configured to receive the instruction signal and to execute an action in response to the instruction signal.

As shown in FIG. 3, the delay circuit 51 can include the oscillator 36 for supplying clock signals, the first register 31, the second register 32, the control unit 33, the storage unit 34, and the first digital timing unit 35.

The first register 31 is configured to be written with a delay reference code. In an embodiment, the delay reference code may be a fuse code or a digital code.

The second register 32 is configured to be written with a delay factor. In an embodiment, the delay factor may be a fuse code or a digital code.

The control unit 33 is configured to determine a corresponding delay ratio in the storage unit 34 based on the delay factor in the second register 32, and to send the determined delay ratio to the first digital timing unit 35.

The storage unit 34 is configured to store all delay factors and their corresponding delay ratios.

The first digital timing unit 35 is configured to determine a delay time based on the delay reference code in the first register 31 and the delay ratio, to generate a delay based on the delay time, and to output an instruction signal to the first action circuit when the delay time expires.

The delay factor may be preset based on the desired delay time and may consist of at least one bit. For example, if the delay factor consists of 1 bit, 2 corresponding delay ratios may be provided; if the delay factor consists of 2 bits, 4 corresponding delay ratios may be provided; if the delay factor consists of 3 bits, 8 corresponding delay ratios may be provided; if the delay factor consists of 4 bits, 16 corresponding delay ratios may be provided, and so forth.

In an embodiment, the storage unit 34 may be configured to pre-store all delay factors and their corresponding delay ratios in a table, in which the delay factors and their corresponding delay ratios are sorted in an ascending order of values of the corresponding delay factors.

In an embodiment, the control unit 33 may be configured to determine a corresponding delay ratio from the table in the storage unit 34 based on the delay factor in the second register 32, and to send the determined delay ratio to the first digital timing unit 35.

In an embodiment, the first digital timing unit 35 may be configured to preset delay reference codes and corresponding delay reference times, to determine a corresponding delay reference time based on the delay reference code in the first register 31, to multiply the delay reference time by the delay ratio to result in a desired delay time, and to generate a delay based on the desired delay time.

In an embodiment, the delay circuit 51 may also include a second digital timing unit 37 configured to determine a corresponding delay reference time based on the delay reference code in the first register 31, to generate a delay based on the delay reference time, and to output an instruction signal to a second action circuit 53 when the delay time expires.

In an embodiment, the integrated circuit may also include the second action circuit 53 configured to execute an action corresponding to the instruction signal from the second digital timing unit 37.

The first and second action circuits 52 and 53 may be a reset circuit, a power-off circuit or any other circuit implementing a particular function.

Additional Notes and Examples

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configured an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A delay circuit, comprising:
   an oscillator configured to supply clock signals;
   a first register configured to be written with a delay reference code;
   a second register configured to be written with a delay factor;
   a storage unit configured to store delay factors and corresponding delay ratios;
   a control unit configured to determine a corresponding delay ratio in the storage unit based on the delay factor in the second register; and
   a first digital timing unit configured to receive the determined delay ratio from the control unit, to determine a delay time based on the delay reference code in the first register and the delay ratio, and to generate a delay based on the delay time.

2. The delay circuit according to claim 1, wherein the storage unit is configured to store all delay factors and their corresponding delay ratios in a table.

3. The delay circuit according to claim 2, wherein the control unit is configured to determine the corresponding delay ratio in the table stored in the storage unit based on the delay factor in the second register and to send the determined delay ratio to the first digital timing unit.

4. The delay circuit according to claim 1, wherein the first digital timing unit is configured to preset the delay reference codes and the corresponding delay reference times, to determine a corresponding delay reference time based on the delay reference code in the first register, to multiply the delay reference time by the delay ratio to result in a desired delay time, and to generate the delay based on the desired delay time.

5. The delay circuit according to claim 1, further comprising:
   a second digital timing unit configured to determine a corresponding delay reference time based on the delay reference code in the first register and to generate a delay based on the delay reference time.

6. A delay method, comprising:
   writing a delay reference code and a delay ratio into different registers, respectively;
   determining a corresponding delay ratio based on the delay factor in the register;
   determining a delay time based on the delay reference code in the register and the delay ratio; and
   generating a delay based on the delay time.

7. The delay method according to claim 6, wherein the delay factor is preset based on a desired delay time and consists of at least one bit.

8. The delay method according to claim 6, further comprising:
   storing all delay factors and their corresponding delay ratios in a table.

9. The delay method according to claim 6, wherein the determining the delay time based on the delay reference code in the register and the delay ratio comprises:
   presetting delay reference codes and their corresponding delay reference times;
   determining a corresponding delay reference time based on the delay reference code in the register; and
   multiplying the delay reference time by the delay ratio to result in the desired delay time.

10. The delay method according to claim 6, further comprising:
    determining a corresponding delay reference time based on the delay reference code in the register; and generating another delay based on the delay reference time.

11. An integrated circuit, comprising:
    a delay circuit; and
    a first action circuit,
    wherein the delay circuit is configured to be written with a delay reference code and a delay factor, to determine a delay ratio corresponding to the delay factor, to determine a delay time based on the delay reference code and the delay ratio, to generate a delay based on the delay time, and to output an instruction signal to the first action circuit when the delay time expires, and
    wherein the first action circuit is configured to receive the instruction signal and to execute an action in response to the instruction signal.

12. The integrated circuit according to claim 11, wherein the delay circuit comprises:
    a first register configured to be written with the delay reference code;
    a second register configured to be written with the delay factor;
    a control unit configured to determine the corresponding delay ratio in the storage unit based on the delay factor in the second register;
    a storage unit configured to store all delay factors and their corresponding delay ratios; and a first digital timing unit configured to receive the determined delay ration from the control unit, to determine the delay time based on the delay reference code in the first register and the delay ratio, to generate the delay based on the delay time, and to output the instruction signal to the first action circuit when the delay time expires.

13. The integrated circuit according to claim 12, wherein the storage unit is configured to store all delay factors and their corresponding delay ratios in a table.

14. The integrated circuit according to claim 13, wherein the control unit is configured to determine the corresponding delay ratio in the table stored in the storage unit based on the delay factor in the second register, and to send the determined delay ratio to the first digital timing unit.

15. The integrated circuit according to claim 12, wherein the first digital timing unit is configured to preset the delay reference codes and their corresponding delay reference times, to determine a corresponding delay reference time based on the delay reference code in the first register, to multiply the delay reference time by the delay ratio to result in a desired delay time, and to generate the delay based on the desired delay time.

16. The integrated circuit according to claim 12, wherein the delay circuit further comprises:
a second digital timing unit configured to determine a corresponding delay reference time based on the delay reference code in the first register, to generate a delay based on the delay reference time, and to output an instruction signal to a second action circuit when the delay time expires; and
wherein the integrated circuit further comprises the second action circuit configured to execute an action in response to the instruction signal from the second digital timing unit.

\* \* \* \* \*